United States Patent
Kouchi et al.

(10) Patent No.: US 6,928,594 B2
(45) Date of Patent: Aug. 9, 2005

(54) SEMICONDUCTOR INTEGRATED CIRCUIT

(75) Inventors: Toshiyuki Kouchi, Yokohama (JP);
Yoshinori Sugisawa, Ayase (JP);
Takehiko Hojo, Yokohama (JP)

(73) Assignee: Kabushiki Kaisha Toshiba (JP)

( * ) Notice: Subject to any disclaimer, the term of this patent is extended or adjusted under 35 U.S.C. 154(b) by 621 days.

(21) Appl. No.: 09/821,163

(22) Filed: Mar. 28, 2001

(65) Prior Publication Data

US 2001/0027546 A1 Oct. 4, 2001

(30) Foreign Application Priority Data

Mar. 28, 2000 (JP) ........................................ 2000-088408

(51) Int. Cl.⁷ .................. G11C 29/00; G06F 12/00; G06F 13/00
(52) U.S. Cl. .................. 714/718; 365/201; 711/105
(58) Field of Search .................. 714/30, 42, 718–722, 714/733–737; 711/105; 365/201

(56) References Cited

U.S. PATENT DOCUMENTS

| | | | |
|---|---|---|---|
| 5,790,839 A | | 8/1998 | Luk et al. |
| 5,913,928 A | * | 6/1999 | Morzano ................ 714/710 |
| 6,072,737 A | * | 6/2000 | Morgan et al. ............ 365/201 |
| 6,163,863 A | * | 12/2000 | Schicht ................... 714/718 |
| 6,169,695 B1 | * | 1/2001 | Duesman ................. 365/201 |
| 6,216,240 B1 | * | 4/2001 | Won et al. ............... 714/718 |

FOREIGN PATENT DOCUMENTS

| | | |
|---|---|---|
| JP | 7-260884 | 10/1995 |
| TW | 353178 | 2/1999 |

* cited by examiner

Primary Examiner—Guy J. Lamarre
Assistant Examiner—Cynthia Britt
(74) Attorney, Agent, or Firm—DLA Piper Rudnick Gray Cary US LLP

(57) ABSTRACT

A logic in DRAM LSI is disclosed, which comprises a plurality of DRAM circuits, a control circuit that receives a test control signal to perform a test control in which the plurality of RAM circuits are tested while the access to the plurality of DRAM circuits is subsequently changed for each row, an input selector that is controlled by the control circuit and inputs a DRAM macro signal to the plurality of DRAM circuits at the time of a test, and an output selector that is controlled by the control circuit, and outputs output signals of the plurality of DRAM circuits sequentially to a macro output terminal at the time of the test. According to the DRAM integrated LSI, a test time required to test the plurality of DRAM circuits integrated in the LSI is shortened. Moreover, data that is read from the plurality of DRAM circuits is transferred in a high speed.

12 Claims, 6 Drawing Sheets

SEMICONDUCTOR INTEGRATED CIRCUIT

CROSS-REFERENCE TO RELATED APPLICATIONS

This application is based upon and claims the benefit of priority from the prior Japanese Patent Application No. 2000-088408, filed Mar. 28, 2000, the entire contents of which are incorporated herein by reference.

BACKGROUND OF THE INVENTION

The present invention relates to a semiconductor integrated circuit having a plurality of macros integrated therein (hereinafter referred to "multi macro integrated semiconductor IC" for brevity) on a semiconductor chip and, more specifically, relates to a control circuit thereof for performing data transfer and testing of macro circuits, and is intended to be used in an LSI (Large Scale Integration) having a plurality of DRAM circuits integrated therein, a DRAM embedded logic LSI having a plurality of DRAM circuits and logic circuits integrated together therein, etc.

As multi macro integrated LSI circuits having a plurality of macro circuits integrated therein, there are DRAM having a plurality of DRAM circuits (macro circuits) integrated therein, a DRAM embedded logic LSI having a DRAM circuit (macro circuit) and a macro circuit of other kind, for example a logic circuit, integrated therein, and the like.

Conventionally, in a LSI having a plurality of DRAM circuits integrated therein, when the plurality of DRAM circuits are to be tested, each of the DRAM circuits is tested independently from each other.

FIG. 7 is a view showing an access pattern for two DRAM circuits DRAM1, DRAM2 in the conventional LSI that is formed of a plurality of DRAM circuits and is, specifically, a view showing a sequence of access in the case where the two DRAM circuits DRAM1, DRAM2 are successively tested. FIG. 8 is a flowchart in the case where the two DRAM circuits are tested in the access pattern of FIG. 7.

In the access pattern, first, the memory cells of a first row in the first DRAM circuit DRAM1 are sequentially accessed over the whole columns. Next, the memory cells of a second row in the first DRAM circuit DRAM1 are sequentially accessed over the whole columns. Such access is repeated from the following row to the last row of the first DRAM circuit DRAM1. After the completion of the access to the first DRAM circuit DRAM1, an access is performed to the memory cells of the second DRAM circuit DRAM2 in the same manner as in the above-mentioned first DRAM circuit DRAM1. That is, the memory cells of a first row in the second DRAM circuit DRAM2 are sequentially accessed over the whole columns. Next, the memory cells of the second row in the second DRAM circuit DRAM2 are sequentially accessed over the whole columns. Such access is repeated from the following row to the last row of the second DRAM circuit DRAM2.

In this case, for each of the first and second DRAM circuits DRAM1 and DRAM2, every time each DRAM circuit is accessed, it is necessary to set an access period tRAS to activate the bank active signal BACT and then select one of the rows of each DRAM circuit to conduct read operation for the memory cells successively over the columns and a precharge period tRP to conduct a bit line precharge operation in response to a bit line precharge signal BPRC. That is, for the first DRAM circuits DRAM1, every time each row of the first DRAM circuits DRAM1 is accessed, it is necessary to set the access period tRAS to activate the bank active signal BACT and then select one of the rows of the DRAM circuit DRAM1 to conduct read operation for the memory cells successively over the columns and the precharge period tRP to conduct a bit line precharge operation in response to a bit line precharge signal BPRC. Similarly, for the second DRAM circuits DRAM2, every time each row of the second DRAM circuits DRAM2 is accessed, it is necessary to set the access period tRAS to activate the bank active signal BACT and then select one of the rows of the second DRAM circuit DRAM2 to conduct read operation for the memory cells successively over the columns and the precharge period tRP to conduct a bit line precharge operation in response to a bit line precharge signal BPRC.

Then, when each of the DRAM circuits DRAM1 and DRAM2 is accessed as described above, it is necessary to take the time tRAS from the activation to the precharge and the time tRP from the precharge to the activation for each DRAM circuit; consequently there is a disadvantage of taking a long time for testing.

FIG. 9 is a flowchart in the case where, in the conventional LSI having a plurality of, for example a synchronous type, DRAM circuits integrated therein, the two DRAM circuits DRAM1, DRAM2 are controlled in a manner such that the data is transferred to the outside thereof.

First, the memory cells of a first row of the first DRAM circuit DRAM1 are accessed sequentially over the whole columns. Next, the memory cells of a first row of the second DRAM circuit DRAM2 are accessed sequentially over the whole columns. Next, the memory cells of a second row of the first DRAM circuit DRAM1 are accessed sequentially over the whole columns. Next, the memory cells of a second row of the second DRAM circuit DRAM2 are accessed sequentially over the whole columns. The access is repeated for all of the of the following rows, from the next row to the last row, while the access to the first DRAM circuit DRAM1 and the access to the second DRAM circuit DRAM2 are alternately changed over for each row.

In this case, every time each row of one of the DRAM circuits is accessed, it is necessary to set an access period tRAS to activate the bank active signal BACT of said one DRAM circuit and to subsequently select one of the rows to conduct read operation for the memory cells successively over the columns and a precharge period tRP to conduct bit line precharge operation by a bit line precharge signal BPRC and to subsequently activate the bank active signal BACT of the other DRAM circuit. That is, every time each row of the first DRAM circuit DRAM1 is accessed, it is necessary to set the access period tRAS to activate the bank active signal BACT of the first DRAM circuit DRAM1 and to subsequently select one of the rows to conduct read operation for the memory cells successively over the columns; and the precharge period tRP to conduct bit line precharge operation by a bit line precharge signal BPRC and to subsequently activate the bank active signal BACT of the second DRAM circuit DRAM2. Similarly, every time each row of the second DRAM circuit DRAM2 is accessed, it is necessary to set the access period tRAS to activate the bank active signal BACT of the second DRAM circuit DRAM2 and to subsequently select one of the rows to conduct read operation for the memory cells successively over the columns and the precharge period tRP to conduct bit line precharge operation by a bit line precharge signal BPRC and to subsequently activate the bank active signal BACT of the first DRAM circuit DRAM1.

However, by a very fact that the time tRAS from the activation to the precharge for each DRAM circuit and the time tRP to precharge one DRAM circuit and then make other DRAM circuit active are required, as described above, when the data that was read from a DRAM circuit by alternately accessing the plurality of DRAM circuits is transferred, there arises a problem when the data is desired to be transferred in a high speed.

FIG. 10 shows a portion of a DRAM circuit corresponding to one bank of the DRAM circuit.

The memory cell array FIG. 10 comprises a sub cell array portion including a plurality of memory cells MC of a one transistor/one capacitor configuration each of which is disposed at each of cross parts that are specified by word lines WLi (WL1, WL2, ..., WLn) arranged in a row direction and bit line pairs BLi, /BLi (BL0, /BL0, BL1, /BL1, ..., BLn, /BLn) arranged in a column direction perpendicular to the row direction; and sense amplifiers S/A that are disposed at both sides of each of the sub cell arrays and amplify the data that was read out to the bit-line BLi or /BLi from the memory cell of the selected row, where the data is written therein or read therefrom via column switch CS that is selected by the column selection line CSLi.

As described above, in the conventional LSI circuit having a plurality of DRAM circuits integrated therein, due to the fact that the time tRAS from the activation to the precharge for each DRAM circuit and the time tRP to precharge one DRAM circuit and then make other DRAM circuit active are required, there is a disadvantage when the data that is read out from each DRAM circuit is desired to be transferred in a high speed. Moreover, there is such a disadvantage that it takes a long time to perform testing of each DRAM circuit.

BRIEF SUMMARY OF THE INVENTION

The present invention is devised to solve the above-mentioned disadvantage and it is an object of the present invention to provide a multi macro integrated semiconductor IC that makes it possible to transfer the data being read from the plurality of DRAM circuits in a high speed.

Further, it is another object of the present invention to provide a multi macro integrated semiconductor IC capable of shortening a test time required to test the plurality of DRAM circuits.

According to a first aspect of the present invention, there is provided a semiconductor integrated circuit comprising: a plurality of DRAM circuits; a control circuit that receives a test control signal to perform a test control in which the plurality of RAM circuits are tested while the access to the plurality of DRAM circuits is subsequently changed for each row; an input selector that is controlled by the control circuit and inputs a DRAM macro signal to the plurality of DRAM circuits at the time of a test; and an output selector that is controlled by the control circuit, and outputs output signals of the plurality of DRAM circuits sequentially to a macro output terminal at the time of the test.

In the semiconductor integrated circuit according to the first aspect of the present invention, the control circuit may be directly connected to a control signal input terminal to be controlled from the control signal input terminal and thereby the control circuit is directly controlled from the control signal input terminal.

In the semiconductor integrated circuit according to the first aspect of the present invention, the input selector may be controlled by the control circuit to input a DRAM macro signal to one of the plurality of DRAM circuits at the time of a normal operation. The control circuit may be directly connected to a control signal input terminal to be controlled from the control signal input terminal and thereby the control circuit is directly controlled from the control signal input terminal.

In the semiconductor integrated circuit according to the first aspect of the present invention, the output selector may be controlled by the control circuit to output an output signal of one of the plurality of DRAM circuits to the macro output terminal at the time of a normal operation. The control circuit may be directly connected to the control signal input terminal to be directly controlled from the control signal input terminal and thereby is controlled directly from the control signal input terminal.

In the semiconductor integrated circuit according to the first aspect of the present invention, the control circuit may perform a test control of the plurality of DRAM circuits in such a manner that the access to first rows of the plurality of DRAM circuits is performed while successively changing the access to the plurality of DRAM circuits, and, following the access to the first rows of the plurality of DRAM circuits, the same access as that to the first rows of the plurality of DRAM circuits is performed from the next rows to the last rows of the plurality of DRAM circuits while successively changing the access to the plurality of DRAM circuits for each row. The control circuit may be connected directly to the control signal input terminal to be directly controlled from the control signal input terminal and thereby the control circuit is directly controlled from the control signal input terminal.

According to a second aspect of the present invention, there is provided a semiconductor integrated circuit comprising: a plurality of DRAM circuits; a plurality of control circuits each of which is provided corresponding to one of the plurality of DRAM circuits, and receives a test control signal to perform a test control of the corresponding one DRAM circuit; and an output selector that is controlled by the control signal, and outputs output signals of the plurality of DRAM circuits sequentially to s macro output terminal at the time of a test.

In the semiconductor integrated circuit according to the second aspect of the present invention, the control circuits may be directly connected to a control signal input terminal to be controlled from the control signal input terminal and thereby the control circuits are directly controlled from the control signal input terminal.

In the semiconductor integrated circuit according to the second aspect of the present invention, the semiconductor integrated circuit may further comprise an input selector for receiving a DRAM macro signal. The control circuits may be directly connected to a control signal input terminal to be controlled from the control signal input terminal and thereby the control circuits are directly controlled from the control signal input terminal.

In the semiconductor integrated circuit according the second aspect of the present invention, the output selector may be controlled by the control circuit to output an output signal of one of the plurality of DRAM circuits to the macro output terminal at the time of a normal operation. The control circuits may be directly connected to a control signal input terminal to be controlled from the control signal input terminal and thereby the control circuits are directly controlled from the control signal input terminal.

In the semiconductor integrated circuit according to the second aspect of the present invention, the control circuits may perform a test control of the plurality of DRAM circuits in such a manner that the access to first rows of the plurality of DRAM circuits is performed while successively changing the access to the plurality of DRAM circuits, and, following the access to the first rows of the plurality of DRAM circuits, the same access as that to the first rows of the plurality of DRAM circuits is performed from the next rows to the last rows of the plurality of DRAM circuits while successively changing the access to the plurality of DRAM circuits for each row. The control circuits may be directly connected to a control signal input terminal to be controlled from the control signal input terminal and thereby the control circuits are directly controlled from the control signal input terminal.

According to a third aspect of the present invention, there is provided a semiconductor circuit comprises: a plurality of DRAM circuits; a control circuit that receives a control signal and controls the plurality of DRAM circuits simultaneously and independently from each other; an input selector for supplying a DRAM macro signal input to one of the plurality of DRAM circuits; an output selector that selects an output signal of one of the plurality of DRAM circuits and outputs the output signal to a macro output terminal.

In the semiconductor integrated circuit according to the third aspect of the present invention, on receiving the control signal, the control circuit may control the plurality of DRAM circuits so that data is read from the plurality of DRAM circuits sequentially and transferred to the outside of the DRAM circuits. The control circuit may operate such that the control circuit supplies the bank active signal BACT to one of the plurality of DRAM circuits and then controls the output selector in a manner such that the output selector selects the output signal of the one DRAM circuit, and then, after the data is read and outputted from columns of the one DRAM circuit sequentially, supplies a bit line precharge signal BPRC to the one DRAM circuit, and the control circuit may operate such that the control circuit supplies the bank active signal BACT to another DRAM circuit while supplying a read signal READ to the one DRAM circuit, and controls the output selector so as to select the output signal of the another DRAM circuit while supplying the bit line precharge signal BPRC to the one DRAM circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
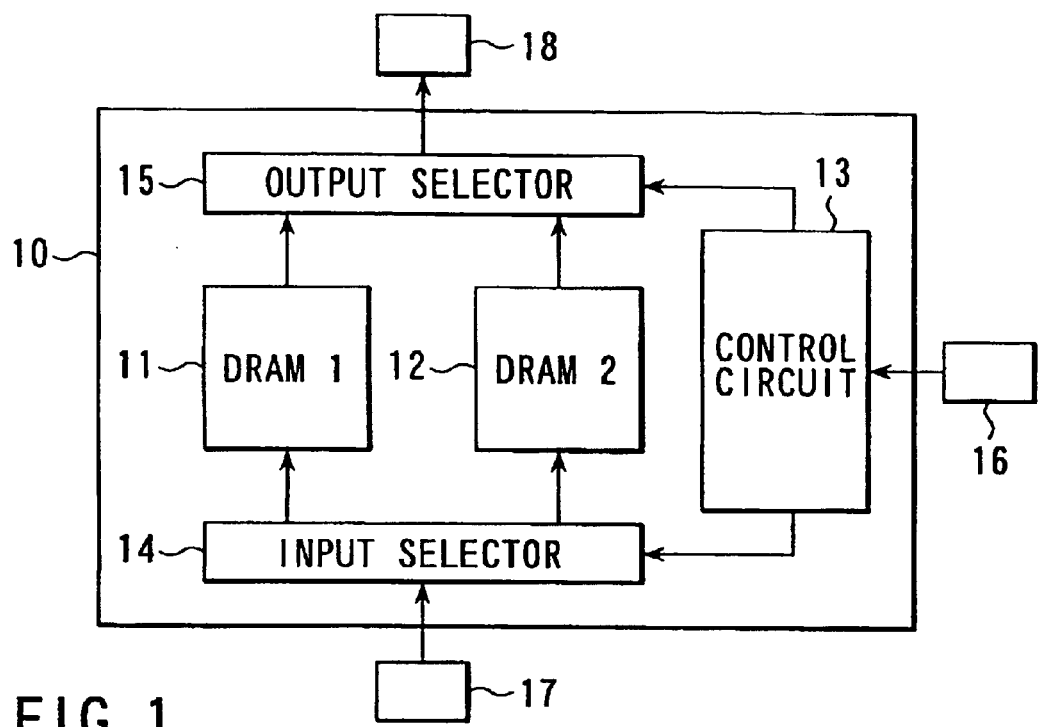
FIG. 1 is a block diagram showing part of a DRAM integrated LSI in which a plurality of (in FIG. 1, two) DRAM circuits (macro circuits) are integrated in a semiconductor chip, according to a first embodiment of the present invention.

Hereafter, embodiments according to the present invention will be described in detail referring to the drawings.

FIG. 1 is a block diagram showing part of a DRAM integrated LSI in which a plurality of (in FIG. 1, as a typical case, two) DRAM circuits (macro circuits) are integrated in a semiconductor chip, according to a first embodiment of the present invention.

The LSI chip comprises a first DRAM circuit 11, a second DRAM circuit 12, a control circuit 13 for performing various controls, such as input/output control to the two DRAM circuits 11 and 12 and test control, in response to a test control signal input, an input selector 14, and an output selector 15.

On the outside of the LSI chip, provided are a control input terminal 16 for inputting test control signals, a macro input terminal 17 for inputting DRAM macro signals, and a macro output terminal 18 for outputting the DRAM macro signals. Further, the above-mentioned test control input terminal 16 is connected to the control circuit 13, the macro input terminal 17 is connected to the input selector 14, and the macro output terminal 18 is connected to the output selector 15.

The input selector 14 supplies the DRAM macro signal (address input, the data input, etc. inputted in a time series mode) inputted via the macro input terminal 17 to a selected one of the two DRAM circuits 11 and 12 at the time of a normal operation; the input selector 14 supplies the DRAM macro signal to both of the two DRAM circuits 11 and 12, at the time of a test when controlled by the control circuit 13.

At the time of the normal operation, the output selector 15 outputs an output signal of a selected one of the DRAM circuits 11 and 12 to the macro output terminal 18; at the time of the test when the output selector 15 is controlled by the control circuit 13, the output selector 15 is controlled so as to select alternately an output signal of the DRAM circuit 11 and an output signal of the DRAM circuit 12 and output alternately output signals to the macro output terminal 18.

Figure 2:
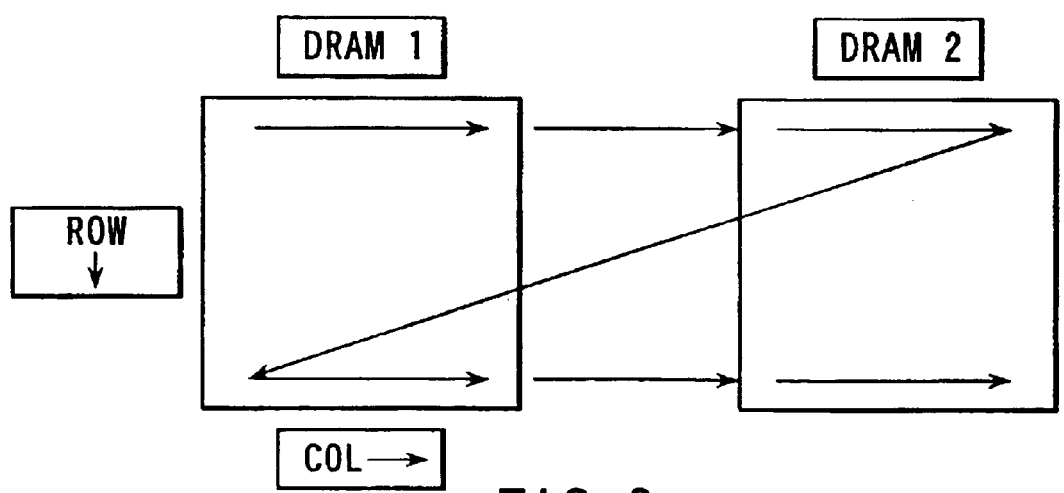
FIG. 2 is a view showing an access pattern for two DRAM circuits in the LSI of FIG. 1 and is, specifically, a view showing the sequence of access in the case where the two DRAM circuits are tested, while successively changing the DRAM circuits to be accessed in a unit of row.
Figure 3:
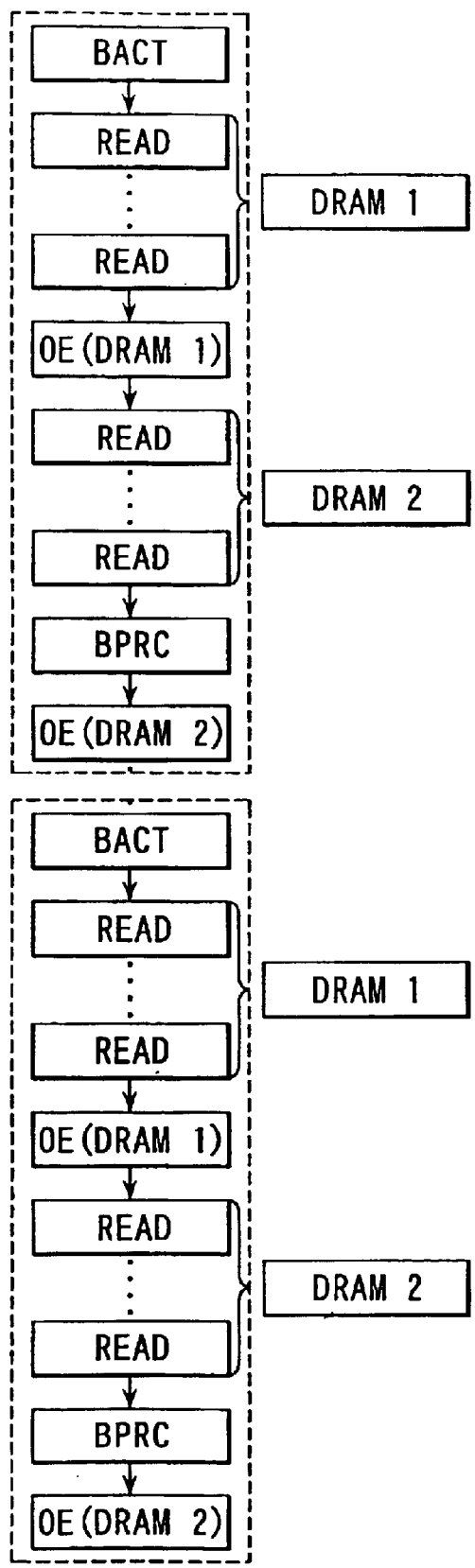
FIG. 3 is a flowchart in the case where the two DRAM circuits are tested in the access pattern shown in FIG. 1, while successively changing the DRAM circuits to be accessed in a unit of row.

FIG. 2 is a view showing an access pattern for the two DRAM circuits 11 and 12 of, for example, a synchronous type in the LSI of FIG. 1 and is, specifically, a view showing the sequence of access when the two DRAM circuits 11 and 12 are tested while the access to the two DRAM circuits 11 and 12 is changed for each row. FIG. 3 is a flowchart in the case where the two DRAM circuits 11 and 12 are tested while the access to the two DRAM circuits 11 and 12 is changed for each row.

When the control circuit 13 receives a control signal inputted via the control input terminal 16, in order to test the two DRAM circuits 11 and 12, the control circuit 13 controls the input selector 14 in a manner such that the DRAM macro signal input is inputted to both of the DRAM circuits 11 and 12 and also controls the output selector 15 in a manner such that the output signals of the DRAM circuits 11 and 12 are alternately outputted to the macro output terminal 18. The test of the two DRAM circuits 11 and 12 is performed while the access to the two DRAM circuits 11 and 12 is changed for each row. That is, first, with respect to first rows of the DRAM circuits 11 and 12, the memory cells of the first row of the first DRAM circuit 11 are accessed successively over the columns, and then the memory cells of the first row of the second DRAM circuit 12 are accessed successively over the columns. Next, with respect to second rows of the DRAM circuits 11 and 12, the memory cells of the second row of the first DRAM circuit 11 are accessed successively over the columns, and then the memory cells of the second row of the second DRAM circuit 12 are accessed successively over the columns. Such access is repeated for the following rows of the two DRAM circuits 11 and 12, from the next row to the last row. In practice, since the semiconductor circuit further includes a third DRAM circuit, a fourth DRAM circuit, . . . and an n-th DRAM circuit, then following the access to the memory cells of the first row of the second DRAM circuit 12, the memory cells of a first row of the third DRAM circuit are accessed successively over the columns, the memory cells of a first row of the fourth DRAM circuit are accessed successively over the columns, and lastly the memory cells of a first row of the n-th DRAM circuit are accessed successively over the columns. Subsequently, after the memory cells of the first row of the n-th DRAM circuit was accessed successively over the columns, the memory cells of the next rows i.e. the second rows of the first DRAM circuit, of the second DRAM circuit, of the third DRAM circuit, of the fourth DRAM circuit, and of the n-th DRAM circuit are accessed similarly. After this, such access is repeated for further next rows of the first DRAM circuit, of the second DRAM circuit, of the third DRAM circuit, of the fourth DRAM circuit, and lastly of the n-th DRAM circuit until the row to be accessed comes to the last one.

Here, the time required to access one row of each of the two DRAM circuits 11 and 12 comprises the following time periods: a first access period when the bank active signal BACT is activated and subsequently a read operation is executed to the memory cells of the first DRAM circuit successively over the columns; a first output period when the output selector 15 is controlled so as to output the data with a predetermined width of the first DRAM circuit 11; a second access period when a read operation is executed to the memory cells of the second DRAM circuit successively over the columns; a precharge period when a bit line precharge operation is executed by a bit line precharge signal BPRC; and a second output period when the output selector 15 is controlled so as to output the data with a predetermined width of the second DRAM circuit. The precharge period and the second output period may be replaced with each other in terms of order.

As described above, since the DRAM circuits are tested while the access to the DRAM circuits is changed for each row, there can be provided an LSI having DRAM circuits integrated therein featured in that a test time is shortened and test efficiency is improved compared to the conventional LSI.

In the above-mentioned LSI having DRAM circuits integrated therein according to the first embodiment of the present invention, the DRAM circuits are controlled by a single control circuit 13. However, also in a DRAM integrated LSI that has a plurality of DRAM circuits each equipped with a test circuit, the present invention can be embodied in a form corresponding to the above-mentioned embodiment, and hereafter its example will be described.

Figure 4:
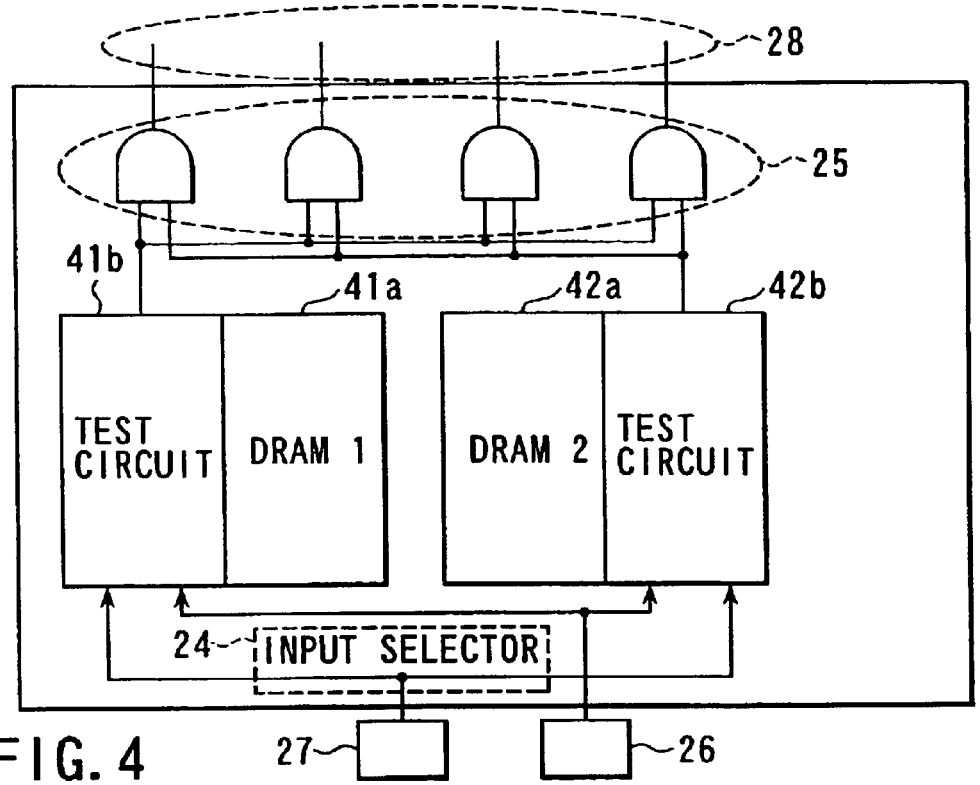
FIG. 4 is a block diagram showing part of a DRAM integrated logic LSI according to a second embodiment of the present invention.

FIG. 4 is a block diagram showing part of a logic LSI having DRAM circuits integrated therein, according to a second embodiment of the present invention.

The LSI chip comprises a first DRAM circuit 41a of, for example, a synchronous type; a second DRAM circuit 42a; a first test circuit 41b for performing various tests on the first DRAM circuit 41a in response to the test control signal; a second test circuit 42b for performing various tests on the second DRAM circuit 42a in response to the test control signal; and a output selector 25.

On the outside of the LSI chip, provided are a control input terminal 26, a macro input terminal 27 for inputting the DRAM macro signals, and a macro output terminal 28 for outputting the DRAM macro signals. The control input terminal 26 is connected to the first test circuit 41a and the second test circuit 42a, the macro input terminal 27 is connected to the first test circuit 41b and the second test circuit 42b, and the macro output terminal 28 is connected to the output terminal 25.

The DRAM macro signal input (an address input, a data input, etc. inputted in a time-series mode) is inputted into the first DRAM circuit 41a via the first test circuit 41b and also inputted into the second DRAM circuit 42a via the second test circuit 42b.

At the time of the normal operation, the output selector 25 selects an output signal that is outputted from the first DRAM circuit 41a via the first test circuit 41b or an output signal that is outputted from the second DRAM circuit 42a via the second test circuit 42b. At the time of the test, the output selector 25 alternately selects the output signal outputted via the first test circuit 41b and the output signal outputted via the second test circuit 42b and outputs the output signal so selected to the macro output terminal 28.

Also in the above-mentioned second embodiment of the logic LSI having DRAM circuits integrated therein, when the two DRAM circuits 41a, 42a are tested, the two DRAM circuits 41a, 42a can be accessed in a way corresponding to the operation of the LSI according to the first embodiment; therefore the LSI of the second embodiment can achieve the same effect as that of the LSI according to the first embodiment. The present invention can be put into practice for an LSI having more than two DRAM circuits integrated therein and when three or more DRAM circuits are tested in the LSI, the DRAM circuits can be accessed in a way corresponding to the operation of the LSI of the above-mentioned first embodiment.

The first test circuit 41b and the second test circuit 42b may be equipped with a function of output data compression (for example, a function of compressing 128 bit data to 8 bit data).

An example of a variant of the second embodiment of the present invention will be herein described.

In the LSI according to the second embodiment, the DRAM macro signal is inputted to both the first test circuit 41b and the second test circuit 42b. However, by adding an input selector 24 as shown by a broken line in FIG. 4, the DRAM macro signal may be inputted only to one of the two test circuits 41a and 42b that is selected by a control signal.

This modification enables, at the time of the test, two different data can be written in the two test circuits 41a and 42a, for example, in a manner that the data consisting of only "1's" is inputted to the first test circuit 41a and the data consisting of only "0's" is inputted to the second test circuit 42a.

In the above-mentioned embodiments, described are examples where the plurality of DRAM circuits are controlled in a mutually identical manner to effect performance of the test. However, the plurality of DRAM circuits may be controlled independently from each other to effect, for example, data transfer. There will be described herein a third embodiment of the present invention in which the plurality of DRAM circuits are controlled independently from each other to effect data transfer with reference to FIG. 5.

Figure 5:
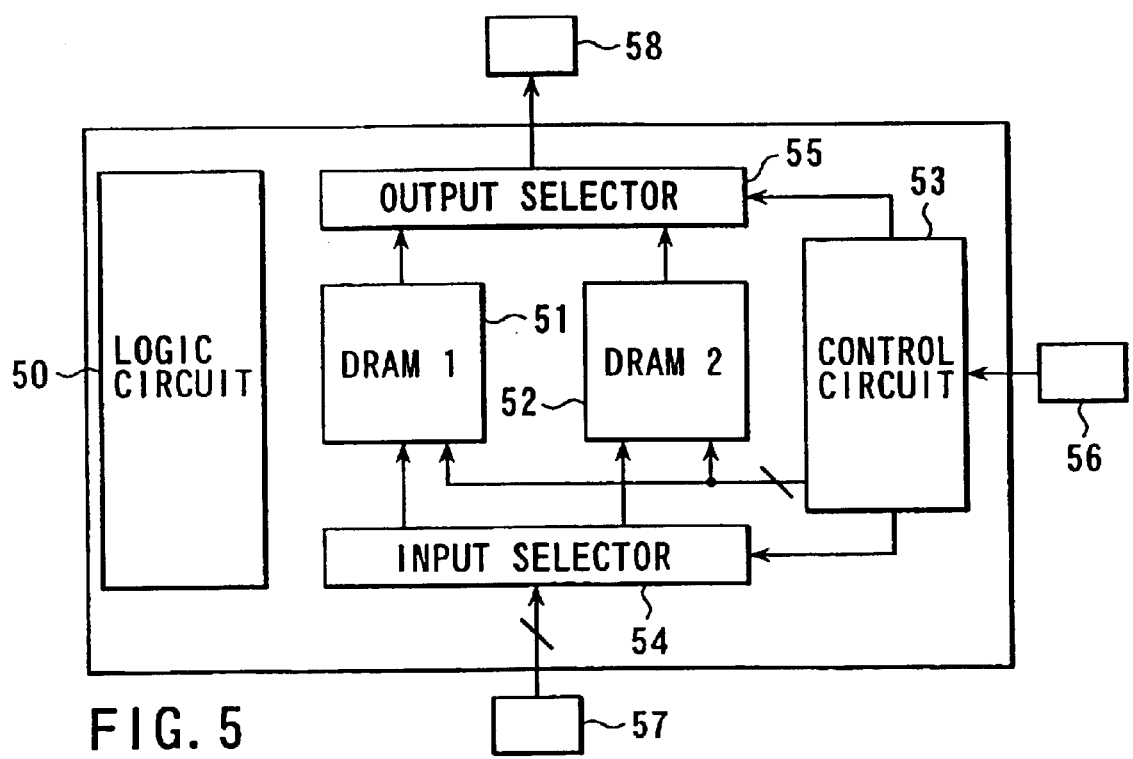
FIG. 5 is a block diagram showing part of a DRAM integrated logic LSI in which a plurality of DRAM circuits (macro circuits) and a single logic circuit (macro circuit) on the same semiconductor chip according to a third embodiment of the present invention, only two DRAM circuits being shown for simplicity.
Figure 7:
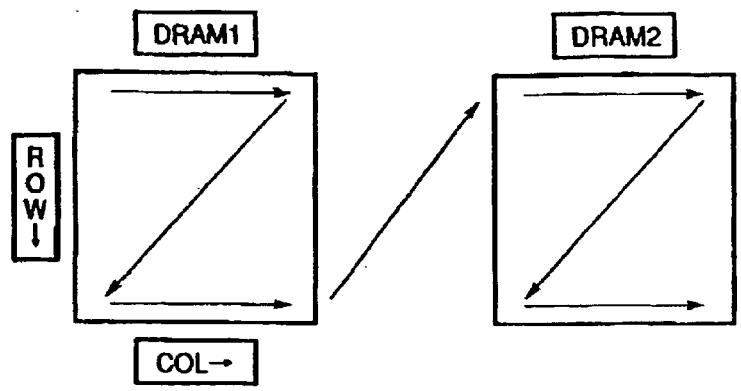
FIG. 7 is a view showing an access pattern for two DRAM circuits in the conventional LSI having a plurality DRAM circuits integrated therein and is, specifically, a view showing the sequence of access in the case where the two DRAM circuits are tested.
Figure 8:
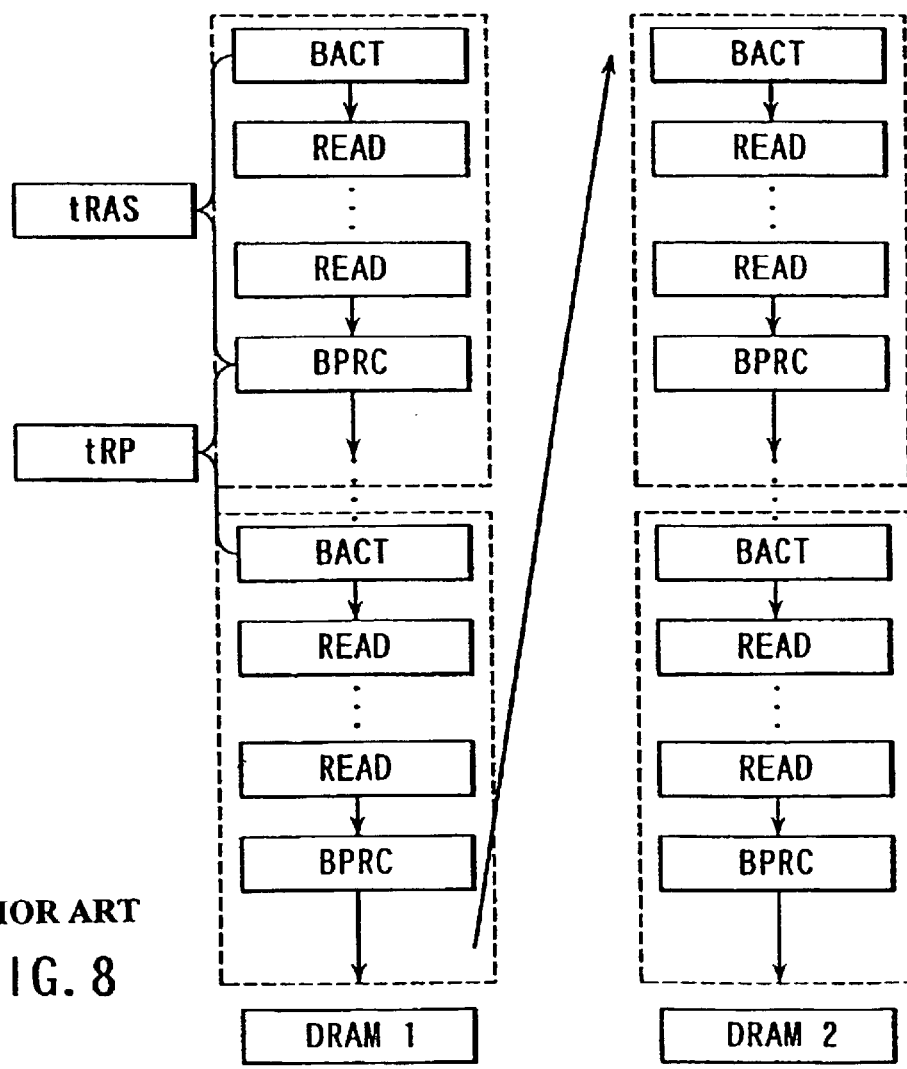
FIG. 8 is a flowchart in the case where two DRAM circuits are tested in the access pattern shown in FIG. 7.
Figure 9:
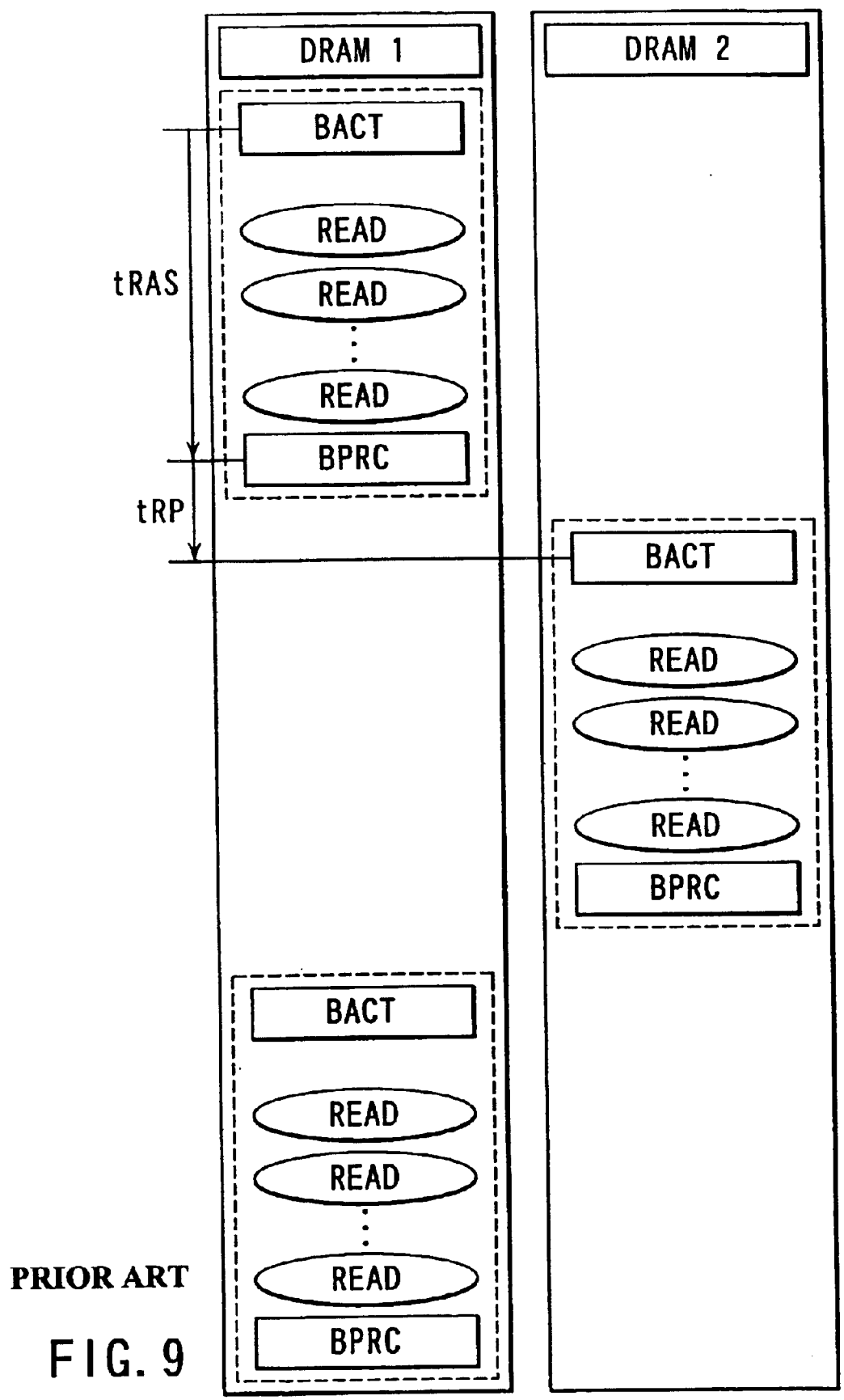
FIG. 9 is a flowchart in the case where the two DRAM circuits are controlled such that the data is transferred to the outside of the DRAM circuits in the conventional LSI having a plurality of DRAM circuits of a synchronous type integrated therein.
Figure 10:
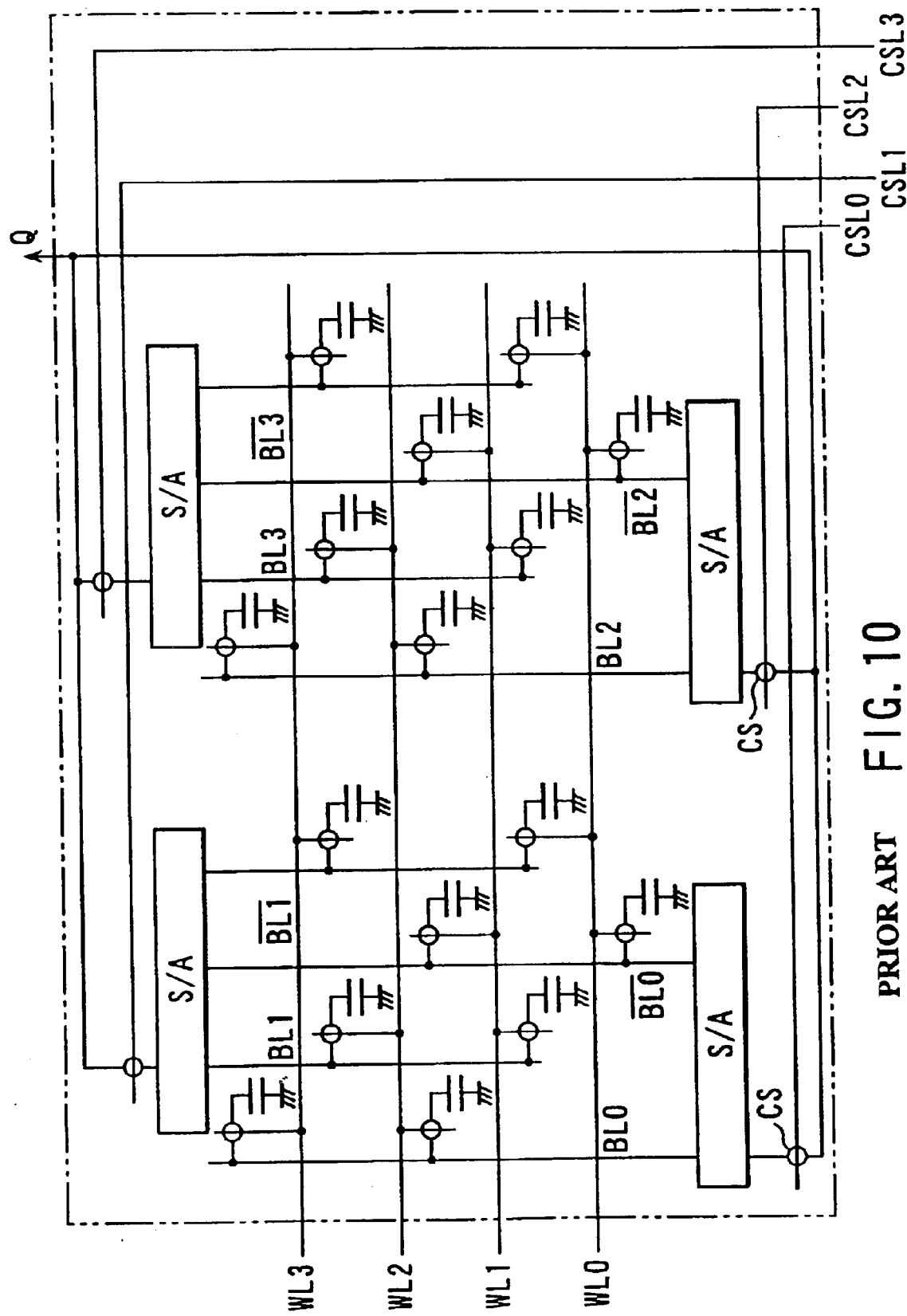
FIG. 10 is a circuit diagram that typically shows a DRAM circuit portion corresponding to one bank of the DRAM circuit.

FIG. 5 is a block diagram showing part of a DRAM integrated logic LSI having a plurality of DRAM circuits (macro circuits) and one logic circuit (macro circuit; for example, a micro computer) integrated on a semiconductor chip.

The LSI chip comprises a logic circuit 50; a first DRAM circuit 51; a second DRAM circuit 52; a control circuit 53 for controlling the DRAM circuits 51 and 52 simultaneously and independently in response to a control signal input; an input selector 54; and an output selector 55.

On the outside of the LSI chip, provided are a control input terminal 56 for inputting control signals, a macro input terminal 57 for inputting the DRAM macro signals; and a macro output terminal 58 for outputting the DRAM macro signals. Further, the control input terminal 56 is connected to the control circuit 53, the macro input terminal 57 is connected to the input selector 54, and the macro output terminal 58 is connected to the output selector 55.

The input selector 54 supplies the DRAM macro signal (an address input, an data input, etc. inputted in a time series mode) inputted thereto via the macro input terminal 57 to a selected one of the two DRAM circuits 51 and 52.

The output selector 54 outputs the output signal of a selected one of the two DRAM circuits 51 and 52 that is selected to the macro output terminal 58.

When the control circuit 53 receives the control signal inputted via the control input terminal 56, the control circuit 53 controls the DRAM circuits 51 and 52 simultaneously and independently from each other to read the data from the DRAM circuits 51 and 52 alternately and transfer the data to the outside of the LSI.

Figure 6:
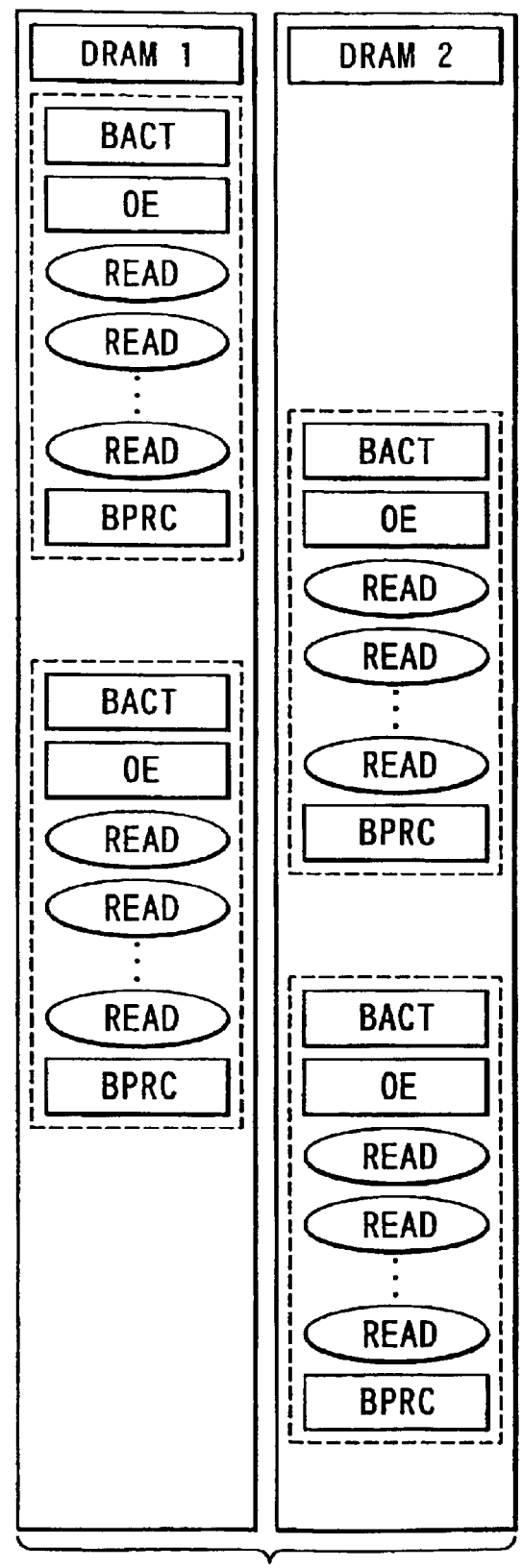
FIG. 6 is a flowchart in the case where the data is read alternately from the two DRAM circuits of the LSI of FIG. 5 and the data is transferred to the outside.

FIG. 6 is an access (interleave access) flowchart in the case where in the LSI of FIG. 5 the DRAM circuits 51 and 52 are activated alternately, and the data is read from the DRAM circuits 51 and 52 alternately and transferred to the outside of the DRAM circuits.

That is, the bank active signal BACT is supplied to the first DRAM circuit 51, then the output selector 55 is controlled to be in a state capable of selecting the output signal of the first DRAM circuit 51 and to sequentially read the data from the columns of the first DRAM circuit 51 and output the data. Subsequently, the bit line precharge signal BPRC is supplied. During these operations, a read out control signal READ is supplied to the first DRAM circuit 51, while the bank active signal BACT is supplied to the second DRAM circuit 52. Further, the bit line precharge signal BPRC is supplied to the first DRAM circuit 51, while the output selector 55 is controlled to be in a state capable of selecting the output signals of the second DRAM circuit 52.

By these operations, it becomes possible that immediately when the read-out of data from the first DRAM circuit 51 corresponding to one batch has been finished, data is sequentially read from the columns of the second DRAM circuit 52 and outputted. Further, a read control signal READ is supplied to the second DRAM circuit 52, while the bank active signal BACT is supplied to the first DRAM circuit 51, and on the other hand a bit line precharge signal BPRC is supplied to the second DRAM circuit 52, while the output selector 55 is controlled to be in a state capable of selecting the output signal of the first DRAM circuit 51.

By repeating such operations, the LSI can be made free from time restraint due to the time tRP from the precharge to the activation when the data is read alternately from the DRAM circuits 51 and 52. That is, the time tRP is apparently masked; therefore this scheme makes it possible to transmit the read-out data in a high speed.

As described in the foregoing, according to the multi macro integrated semiconductor IC of the present invention, the test time required to perform testing of the plurality of DRAM circuits can be shortened and the read-out data of the plurality of DRAM circuits can be transferred in a high-speed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit comprising:
   a plurality of DRAM CIRCUITS;
   a control circuit that receives a test control signal to perform a test control in which said plurality of RAM circuits are tested while the access to said plurality of DRAM circuits is subsequently changed for each row and said plurality of DRAM circuits are cyclically accessed for each row;
   an input selector that is controlled by said control circuit and inputs a DRAM macro signal to said plurality of DRAM circuits at the time of a test; and
   an output selector that is controlled by said control circuit, and outputs output signals of said plurality of DRAM circuits sequentially to a macro output terminal at the time of the test.

2. A semiconductor integrated circuit according to claim 1, wherein said control circuit is directly connected to a control signal input terminal to be controlled from said control signal input terminal and thereby the control circuit is directly controlled from said control signal input terminal.

3. A semiconductor integrated circuit according to claim 1, wherein said input selector that is controlled by said control circuit to input a DRAM macro signal to one of said plurality of DRAM circuits at the time of a normal operation.

4. A semiconductor integrated circuit according to claim 3, wherein said control circuit is directly connected to a control signal input terminal to be controlled from said control signal input terminal and thereby the control circuit is directly controlled from said control signal input terminal.

5. A semiconductor integrated circuit according to claim 1, wherein said output selector is controlled by said control circuit to output an output signal of one of said plurality of DRAM circuits to the macro output terminal at the time of a normal operation.

6. A semiconductor integrated circuit according to claim 5, wherein said control circuit is directly connected to said control signal input terminal to be directly controlled from said control signal input terminal and thereby is controlled directly from said control signal input terminal.

7. A semiconductor integrated circuit according to claim 1, wherein said control circuit performs a test control of said plurality of DRAM circuits in such a manner that the access to first rows of said plurality of DRAM circuits is performed while successively changing the access to said plurality of DRAM circuits, and, following the access to the first rows of said plurality of DRAM circuits, the same access as that to the first rows of said plurality of DRAM circuits is performed from the next rows to the last rows of said plurality of DRAM circuits while successively changing the access to said plurality of DRAM circuits for each row.

8. A semiconductor integrated circuit according to claim 7, wherein said control circuit is connected directly to said control signal input terminal to be directly controlled from the control signal input terminal and thereby the control circuit is directly controlled from said control signal input terminal.

9. A semiconductor integrated circuit comprising:
   a plurality of DRAM circuits;
   a plurality of control circuits each of which is provided corresponding to one of said plurality of DRAM circuits, and receives a test control signal to perform a test control of said corresponding one DRAM circuit; and
   an output selector that is controlled by said control signal, and outputs output signals of said plurality of DRAM circuits sequentially to a macro output terminal at the time of a test;
   wherein said control circuits performs a test control of said plurality of DRAM circuits in such a manner that the access to first rows of said plurality of DRAM circuits is performed while successively changing the access to said plurality of DRAM circuits, and, following the access to the first rows of said plurality of DRAM circuits, the same access as that to the first rows of said plurality of DRAM circuits is performed from the next rows to the last rows of said plurality of DRAM circuits while successively changing the access to said plurality of DRAM circuits for each row.

10. A semiconductor integrated circuit according to claim 9, wherein said control circuits are directly connected to a control signal input terminal to be controlled from said control signal input terminal and thereby the control circuits are directly controlled from said control signal input terminal.

11. A semiconductor integrated circuit comprising:
    a plurality of DRAM circuits;
    a control circuit that receives a control signal and controls said plurality of DRAM circuits simultaneously and independently from each other;
    an input selector for supplying a DRAM macro signal input to one of said plurality of DRAM circuits; and
    an output selector that selects an output signal of one of said plurality of DRAM circuits and outputs the output signal to a macro output terminal,
    wherein on receiving the control signal, said control circuit controls said plurality of DRAM circuits so that data is read from said plurality of DRAM circuits sequentially and transferred to the outside of the DRAM circuits.

12. A semiconductor integrated circuit according to claim 11, wherein said control circuit supplies the bank active signal BACT to one of said plurality of DRAM circuits and then controls said output selector in a manner such that said output selector selects the output signal of said one DRAM circuit, and then, after the data is read and outputted from columns of said one DRAM circuit sequentially, supplies a bit line precharge signal BPRC to said one DRAM circuit, and
    said control circuit supplies the bank active signal BACT to another DRAM circuit while supplying a read signal READ to said one DRAM circuit, and controls said output selector so as to select the output signal of said another DRAM circuit while supplying the bit line precharge signal BPRC to said one DRAM circuit.

* * * * *